United States Patent [19]

McNiece et al.

[11] 4,083,616
[45] Apr. 11, 1978

[54] PRINTED WIRING BOARD LEVERED INJECT-EJECT CAM

[75] Inventors: Reginald C. McNiece, Altamonte Springs, Fla.; Warren W. Porter, Escondido, Calif.

[73] Assignee: Stromberg-Carlson Corporation, Rochester, N.Y.

[21] Appl. No.: 766,318

[22] Filed: Feb. 7, 1977

[51] Int. Cl.² .......................................... H01R 13/54
[52] U.S. Cl. ................................................ 339/45 M
[58] Field of Search ............... 339/45 R, 45 M, 75 MP

[56] References Cited
U.S. PATENT DOCUMENTS

| | | | |
|---|---|---|---|
| 3,451,034 | 6/1969 | Beale | 339/45 R |
| 3,476,258 | 11/1969 | Dorsett | 339/45 M |
| 3,784,954 | 1/1974 | Grimm | 339/45 M |
| 3,952,232 | 4/1976 | Coules | 339/45 M |

*Primary Examiner*—Neil Abrams
*Attorney, Agent, or Firm*—Michael F. Oglo

[57] ABSTRACT

A levered inject-eject cam device is provided for pivotal mounting at the upper and lower corners of the rear edge of a printed wiring board. The cam is constructed of an integral molded body member having a bifurcated configuration which forms branching members which receive the wiring board therebetween. The branching members form flat stock members and the cam is formed as a profile shape of these flat stock members to engage a fixed engageable strip which extends toward the edges of the printed wiring board from the frame of the wiring board cell. A tyne is integrally molded into each branching member to resiliently grasp the board. The tynes provide sliding friction which permit the cams to be prepositioned before the wiring board is inserted into the cell so that the cams will be in proper position to cam the engageable strip, and not be in an undesired position in which the cam lobe strikes against the engageable strip and prevents insertion.

2 Claims, 8 Drawing Figures

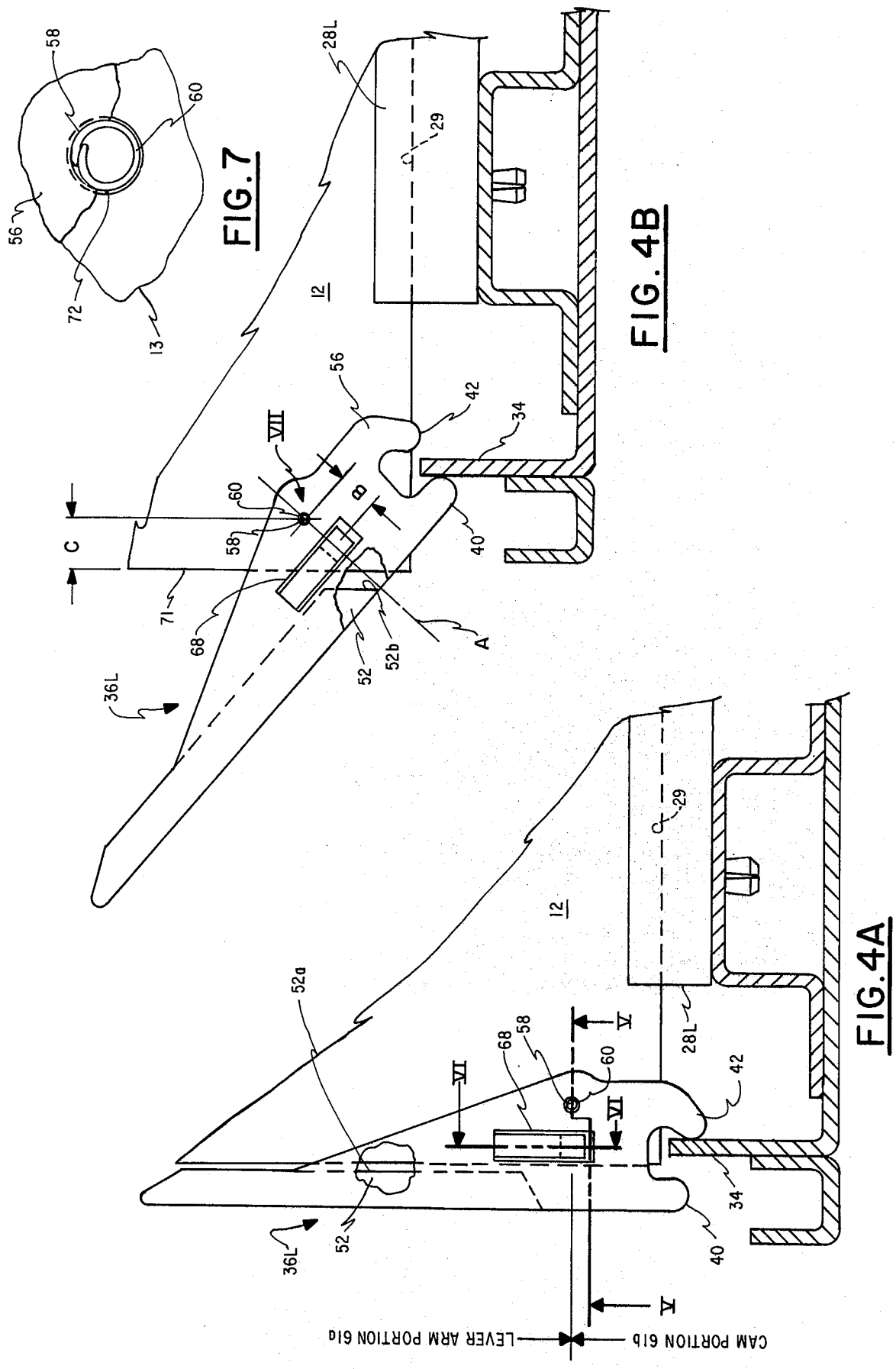

PRINTED WIRING BOARD LEVERED INJECT-EJECT CAM

BACKGROUND OF THE INVENTION

1. Field of the Invention

This invention relates to printed wiring board assemblies and more particularly to levered inject-eject cam arrangements for mounting at the corners of the outside edge of wiring boards to cam the wiring boards into and from their fully plugged-in position.

2. Description of the Prior Art

Levered inject-eject cams which are of a molded integral body bifurcated configuration for mounting with the wiring board interposed between the branch members formed by the bifurcation are common in the art. However, prior to the present invention their application has generally been limited to small sized printing wiring boards which can be inserted using both of the hands of the installer to hold the levered cams in a position to properly cam an engageable strip, and not in an undesired position in which the cam lobes strikes against the engageable strip and prevents insertion. Wiring boards having a larger top to bottom dimension require use of one of the installer's hands to steady the board, and therefore, the prior art devices could not be conveniently used with these larger boards. The same is true in connection with the installations of any size board in equipment cabinets having cells at a height beyond the reach of the persons hands for purposes of prepositioning the upper levered cam.

Of course, it is desired that any cam assembly be produced with the lowest possible manufacturing cost, and this can best be achieved by manufacturing the levered cam as an integrally molded plastic part.

Accordingly, an object of the invention is to provide a levered cam device for use in printed wiring board assemblies which does not require that the person making the installation manually maintain the levered cam in a particular position while inserting the board into the cell.

Another object of the invention is to provide a levered cam in accordance with the preceding objective, which further may be manufactured as an integrally molded plastic device.

SUMMARY OF THE INVENTION

A cell is formed in an electrical equipment cabinet for recieving a plurality of printed wiring board assemblies in a vertical attitude. The wiring board assemblies are installed from an open end of the cell with their upper and lower edges engaged in wiring board grooves. The front end of the wiring board (i.e., the end which extends into the cell) has electrical contacts which engage spring contactors contained in a connector at the inner end of the cell. A pair of levered inject-eject cams are pivotally mounted to the corners of the outer end of the wiring board with the cam portions extending downwardly and upwardly from the board to cam against fixed engageable strips which are generally adjacent to the position of the rear end of the upper and lower edges of the board when the board finally is inserted in the cell. In this position the strips are transverse to the direction of motion in inserting and ejecting the wiring board into and from its fully plugged-in position. Also the strips have edges extending toward upper and lower edges of the board. The strips are fixed to rigid structure of the electrical cabinet. The levered inject-eject cams are employed to fully insert a wiring board assembly into its plugged-in position, i.e., with the contactors at its inner edge engaging the spring contactors. Both levered inject-eject cams must be pivoted to move the wiring board into the fully plugged-in position by camming against the strips.

Each levered cam is formed of a unitary body member having a bifurcated configuration. This configuration forms a pair of bifurcated branching members. The wiring board is sandwiched between the branching members.

The branching members are formed as flat stock members perpendicular to the pivot axis, and the cam surface is formed as the same profile shape of both flat stock branching members. This profile shape consists of two spaced lobes which bear against the engageable strips to respectively cam the wiring board into a fully plugged-in position or eject the wiring board from its fully plugged-in position. The levered cam must be prepositioned to a pivotal position in which the lobes do not interfere the engageable strips upon sliding the wiring board into the cell.

Each of the flat stock branching members of the bifurcated configured cam body has a tyne formed therein. These tynes resiliently engage the confronting face of the wiring board. This causes sliding friction which enables the levered cam to be prepositioned as aforesaid. The tyne is formed in the course of integrally molding the levered cam as a one piece plastic part. The resilient engagement is obtained by making the tyne structures thinner than the flat stock element so that it may readily resiliently flex. The tynes are provided with a small protuberance extending towards the confronting face of the wiring board. The thickness of the protuberance is such that the tynes resiliently deflect when the wiring board is sandwiched between the branching members of the cam body. The protuberance at the end of the tyne is positioned at a radial distance from the pivot point which is less than the distance from the pivot point to the edge of the wiring board, so that the tyne will engage the surface of the wiring board at all angular positions of the levered cam.

BRIEF DESCRIPTION OF THE DRAWINGS

FIGS. 4A and 4B are enlarged details indicated by arrow IV, FIG. 1, showing portions of the structure of the cell, the wiring board, and the levered cam in two alternate positions of the levered cam, FIG. 4A being partially cut away to expose a surface which provides a limit stop to clockwise rotation and FIG. 4B being partially cut away to expose a surface which provides a limit stop to counter-clockwise rotation;

FIG. 5 is a cross-section of FIG. 4A taken along line V—V, the structure of the wiring board and of the pivot pin being omitted and the tynes being shown in their position before deformation due to the presence of a wiring board being interposed between branching member portions;

FIG. 6 is a section taken along line VI—VI, FIG. 4A, the wiring board element being omitted and the tynes being shown in their position before deformation; and FIG. 7 is an enlargement of a detail indicated by arrow VII, FIG. 4B, a certain portion of the body member of the levered inject-eject cam being cut away to expose the underlined wiring board and its pivot hole opening.

DESCRIPTION OF THE PREFERRED EMBODIMENT

Figure 1:
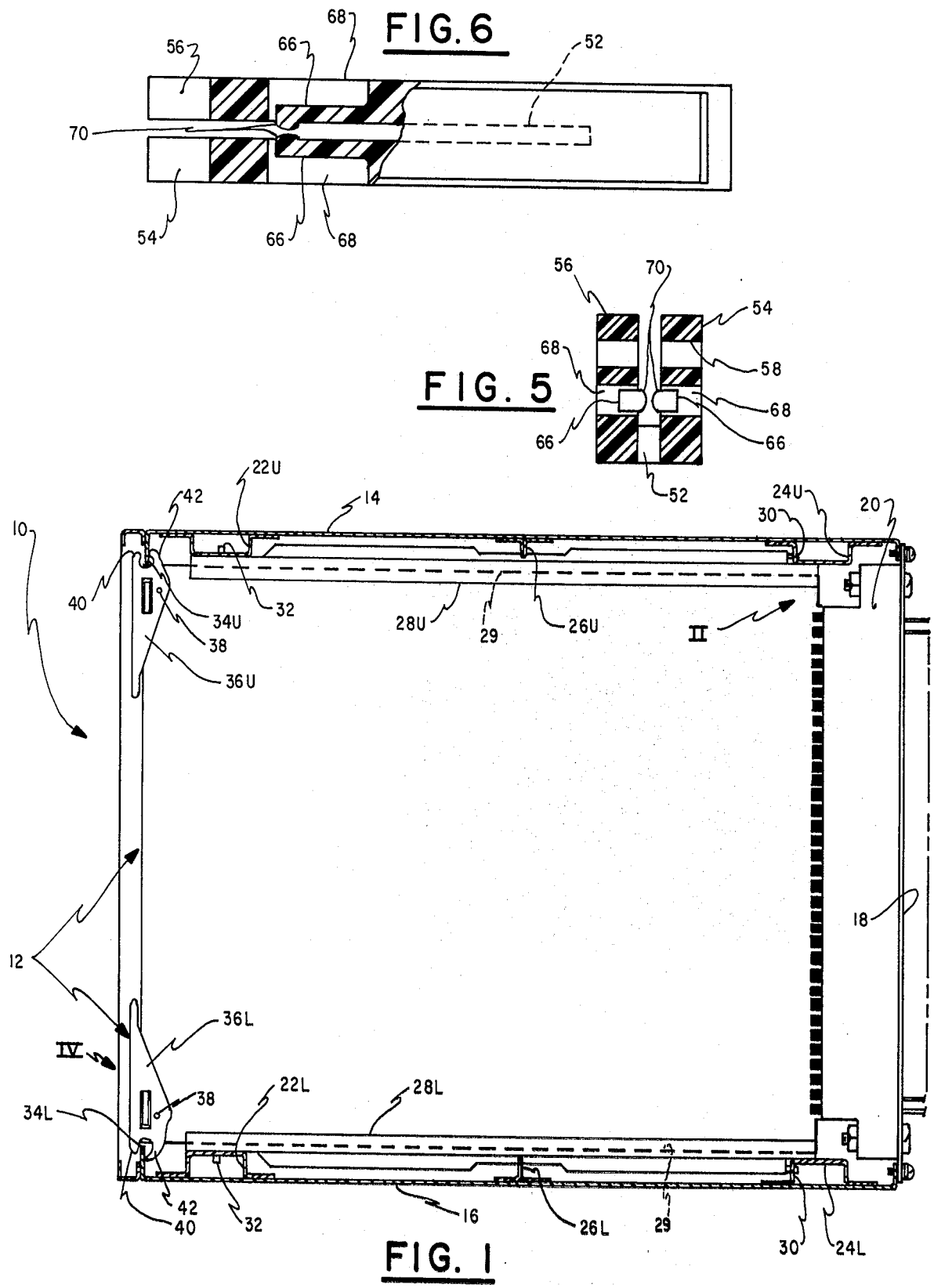
FIG. 1 is a longitudinal section through a cell of an electrical equipment cabinet for receiving printed wiring board, which cell contains a wiring board assembly which incorporates a pair of lever inject-eject cam devices of the present invention, the wiring board assembly being shown in side elevation, the wiring board assembly being in its position after insertion into fully plugged-in position by operation of the levered cam.

Referring now to the drawing, and in particular to FIG. 1, a cell 10 for receiving a plurality of printed wiring board assemblies 12 (only one is shown) is formed from an upper panel 14, lower panel 16 and a back plane wiring board assembly 18. A connector assembly 20 is secured by bolts to the back plane board assembly 18. The upper and lower panels are stiffened by channel pieces 22U and 22L adjacent the open or outer end of the cell, and transversely extending channel members 24U, and 24L adjacent the back plane or inner end of the cell. These channel pieces extend transversely to the plane of the drawing. A pair of T-sectioned stiffener members 26U and 26L are affixed to upper panel 14 and lower panel 16, respectively, midway between the inner and outer ends of the cell. Members 26U and 26L extend in a direction transverse with respect to the plane of the drawing. T-sectioned members 26U and 26L have notches formed therein to receive and contribute to the alignment of the upper and lower printed wiring board guides 28U and 28L. Each of these guides is made of a single plastic molded element. Its inner end is maintained in alignment by a non-binding longitudinally extending pin 30 which is inserted in an opening in one of the lateral wall portions of the adjacent channel member (24U or 24L as the case may be). Its outer end is fastened and maintained in alignment by a transversely extending detent pin 32 which is engaged in an opening formed in the plateau wall of the adjacent channel member (24U or 24L as the case may be). Each guide 28 is provided with a channel 29 in which the lateral edge of the wiring board 12 slides.

At the outer ends of the upper and lower panels 14 and 16, marginal edges of the panels are bent to form a rigid engageable strip, which extends toward and is positioned adjacent to the outer edge of the wiring board when the latter is in its fully plugged-in position. A pair of levered inject-eject cams 36U and 36L are pivotally mounted to wiring board 12 by means of pivot pins 38 at the upper and lower corners, respectively, of the outer end of the board. Each cam has its cam portion disposed so that it may extend laterally outward relative to the adjacent side edge of the wiring board where its two spaced lobes 40 and 42 may bear against the opposite sides of engageable strip 34 to alternatively cam the printed wiring board 12 into a fully plugged-in position, or cam same out of a fully plugged-in position.

Figure 2:
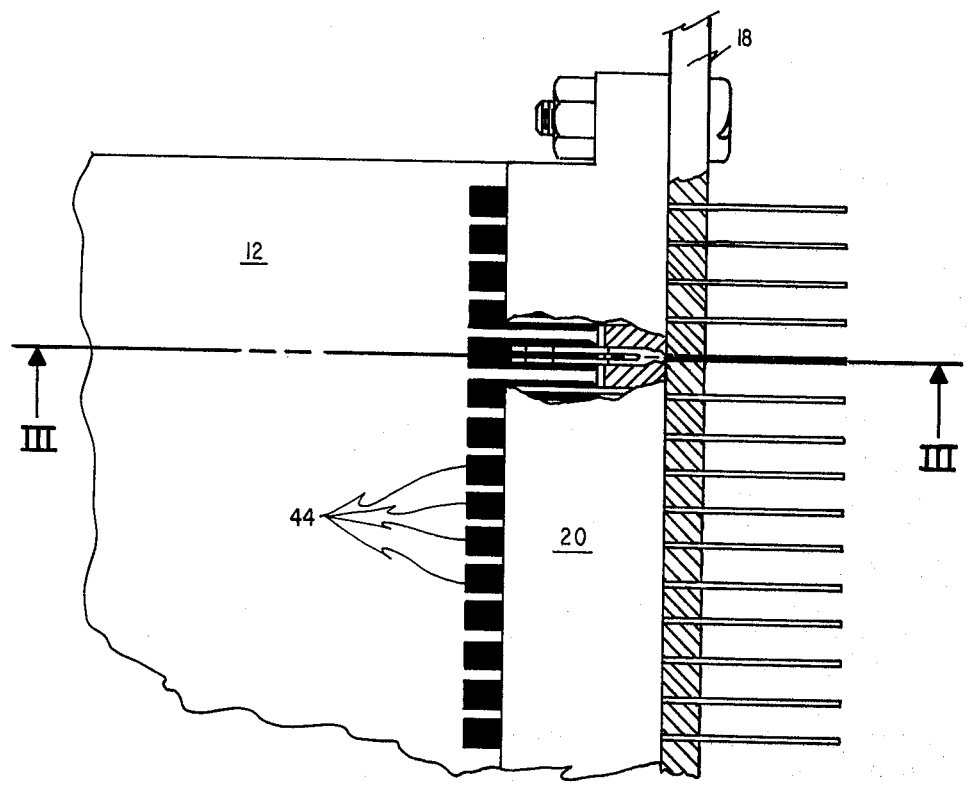
FIG. 2 is an enlarged detail of FIG. 1 indicated by arrow II, showing an enlarged view of the inner end of the wiring board, with a portion of the connector assembly cut away to expose the pin and spring contactor structure.
Figure 3:
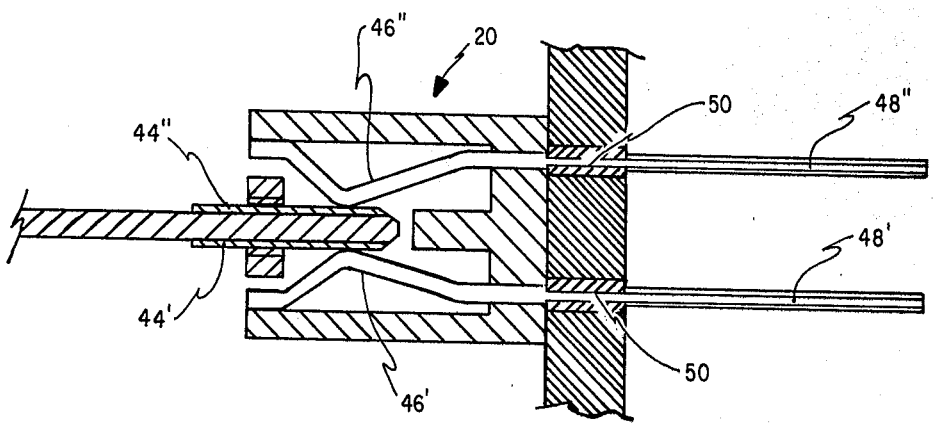
FIG. 3 is a section taken along lines III—III of FIG. 2.

Reference is now made to FIGS. 2 and 3 for a description of the arrangement of metallized contact areas at the inner end of wiring board assembly 12 and the connector assembly 20 for making electrical contacts between the board and the back plane assembly 18. Fingers 44 formed of metallized areas on the board provide electrical access to the various electrical circuit components (not shown) associated with the printed wiring board assembly 12. As best shown in FIG. 3, metallized finger areas 44' and 44'' are formed on opposite sides of the boards. The connector assembly 20 holds a pair of spring contactors 46' and 46'' which are in confronting relationship to receive the two sides of the wiring board therebetween. The back plane ends of spring contactors 46' and 46'' formed pins 48' and 48'' which extend through plated openings 50 in back plane wiring board assembly 18. It will be appreciated that the camming actions of lobes 40 and 42 of the levered inject-eject cams 36U and 36L acting against the transverse strips 34U and 34L operate to force the front edge of the wiring board between spring contactors 46' and 46'' against the resilient force thereof. Also, it is the cumulative jamming force of all of the spring contactors 46' and 46'' of the connector assembly 20 acting against the fingers at the inner edge of the wiring board 12 which maintains board 12 locked in position against vibration or other forces which might loosen a board.

Reference is now made to FIGS. 4A, 4B, 5 and 6 for a detailed description of the construction and mounting of levered inject-eject cams 36U and 36L. Each levered cam is a single piece molding and, is best shown in FIGS. 5 and 6, the portion thereof which forms the camming surface is of bifurcated configuration having a trunk portion 52 and branching portions 54 and 56. Branching portions 54 and 56 are formed as substantially flat stock elements and the camming surfaces consisting of spaced lobes 40 and 42 which are formed as the same profile shape of both flat stock branching members. The hole 58 for receiving pivot pin 60 (FIGS. 4A, 4B and 7) passes through a bifurcated portion of the levered cam.

The range of pivotal motion of a levered inject-eject cam 36L about pin 60 with the board assembly 12 interposed between branching bifurcated portions 54 and 56 is best seen from FIGS. 4A and 4B. The lever arm (levered cam 36L) is basically composed of a lever arm portion 61a and a cam portion 61b on diametrically opposite sides of pivot pin 58. The trunk portion 52 which joins the two branching bifurcated portions 54 and 56 is essentially located within lever arm portion 60. As shown in the cut away portion of FIG. 4A, trunk portion 52 has a surface 52a which is essentially longitudinally aligned with the lever arm portion 61a. Surface 52a is the limit stop for pivotal motion of levered cam 36L in the clockwise direction. However, clockwise limit stop does not occur in injecting board assembly 12 into cell 10. Engagement of lobe 42 against the inner face of engageable strip 34 injects board assembly 12 into its fully plugged-in position causes lever cam 36L to stop in the position shown in FIG. 4A. As shown in the cut away portion of FIG. 4B, trunk portion 52 has a surface 52b which is bevelled with a predetermined angle relative to surface 52a. Surface 52b is the limit stop for pivotal motion of levered cam 36L in the counter-clockwise direction. However, counter-clockwise limit stop does not occur in ejecting board assembly 12 from cell 10. Engagement of lobe 40 against the outer face of engageable strip 34 causes assembly board 12 to be ejected out of its plugged-in condition in the position of the levered cam 36L shown in FIG. 4B.

It will be appreciated that a portion of the range of angular positions of levered cam 36L at the inject end of its swing causes lobe 42 to be in a position in which it would strike engageable strip 34 before board assembly 12 is moved to a position in which lobe 42 may cam the board into a fully plugged-in position. To deal with this problem, tynes 66 (best shown in FIG. 6) are formed in both branching portions 54 and 56 to resiliently engage the wiring board 12 and thereby provide sufficient sliding friction to enable the cam to be prepositioned to avoid this interference. Each tyne 66 is formed as an integrally molded element of the one piece body of the levered cam 36. This is done by providing a rectangular slot 68 with the tynes molded as a peninsular element extending into the slot. The thickness of each tyne 66 is chosen to enable resilient flexing, and a protuberance 70 is formed at the end of each tyne extending into the opening between branching bifurcated members 54 and 56. As a result when the board 12 is interposed between the branching bifurcated portions 54 and 56, the tynes 66 are resiliently flexed outwardly with each protuberance 70 resiliently engaging its confronting face of the board 12.

The protuberances 70 are centered on a radial line A, Fig. 4B which extends through the center of the pivot pin hole 58 in a direction perpendicular to the nominal axis of lever arm portion 61a. More particularly the protuberances are located at a radial distance B from the center of hole 58, which is less than the radial distance C between such center and the outer edge 71 of wiring board 12. This insures that the tyne will provide the resilient engagement throughout the entire range of pivotal positions of the levered inject-eject cam 36.

Reference is now made to FIG. 7. Pivot pin 58 is formed from rolled sheets stock and provides a force fit with respect to the pivot pin hole 58 in branching portion 56. However, the pivot pin hole 72 formed in the wiring board 12 is somewhat enlarged to provide a loose fit between pin 58 and the hole 72. This loose fit enables a small eccentric motion during the process of camming of the lobes 40 and 42 against the sides of rigid transfer strip 34, which has been found to enhance the camming action.

Referring again to FIG. 1 the installation of printed wiring board assembly 12 into wiring board cell 10 is accomplished by prepositioning both levered inject-eject cams 36U and 36L into positions with the lever arm portions pulled away from the rear edge of the wiring board 12 so that lobes 42 will not be in a position in which they would interfere with the associated engageable strip 34. The assembly is then slid with its lateral edges engaging in the channel 29 of wiring board guides 28 to a near plugged-in position. At that time the lever arm portions 61a of both levered cams are simultaneously pushed in towards the outer edge of board 12 and the lobes 42 cam against the inside surface of the engageable strips 34 moving the board into fully plugged-in condition. Referring again to FIGS. 2 and 3, jamming of the metallized fingers 44 at the inner ends of board 12 between spring contacts 46 resists further movement of lever arm portions 61a when the board is in its fully plugged-in position. It will be appreciated that pressure must be applied simultaneously to the lever arm portions 61a of both levered cam 36U and 36L to effectively seat the metallized contact areas 44 in the corresponding spring contacts 46.

From the foregoing, it will be appreciated that the tynes 66 have a very important role in making it convenient for board assembly 12 to be installed. Since the levered cams 36 may be prepositioned the installation may be done as two steps consisting of: (i) sliding the card into the grooves 29 of guides 28 while the board is held by its edge, and (ii) final application of simultaneous pressure to both lever arm portions 50. Ejection is performed by pulling lever arm portions 61a away from the edge of board 12 to cause the lobes 40 to engage the outer sides of engageable strips 34 and thereby move the board 12 out from jammed contact with connector element 20.

An important advantage of obtaining the sliding friction for prepositioning the levered inject-eject cams by means of the described tyne configuration is that it results in a part which may be formed as a single member in a molding operation. By selection of a plastic to have a desired modulus of elasticity, the resilience can be obtained in a molded plastic construction without sheer strains which would result in fracture of the part.

It will be understood by those skilled in the art that numerous variations and modifications may be affected to the preferred embodiment without departing from the spirit and scope of the invention hereinafter claimed.

What is claimed is:

1. Inject-eject cam apparatus for mounting at a corner of the outer edge of a wiring board with its cam surfaces extending laterally from the board for engagement with a fixed engageable means which is adjacent to said outer edge of the board when the board is in its fully plugged-in position in a wiring board cell, said apparatus comprising:

(a) an integral body member forming a lever arm portion and inject-eject cam portion and adapted for pivotal mounting about a pivot axis between the lever arm and cam portions, (b) said body member being of a bifurcated configuration forming a pair of branching portions shaped as flat stock members perpendicular to the pivot axis, said pivot axis passing through the branching bifurcated portions, whereby the body member is adapted for pivotal mounting to the wiring board with the wiring board interposed between the branching portions, (c) said flat stock members being shaped in profile to form the cam surfaces as edges of the flat stock members, said cam surfaces cooperating with the fixed engageable means to alternatively inject the wiring board into its fully plugged-in position or to eject same from its fully plugged-in position under actuation of said lever arm portion in one and the other of opposite pivotal directions, (d) each branching portion formed as a flat stock member further forms a tyne having an end which projects toward the confronting face of a wiring board interposed between the branching portions, the construction and arrangement of the tyne being such that it flexes under engagement between said end of the tyne and the confronting face of the board to thereby provide sliding friction to allow prepositioning of the cam portion at a pivotal position whereat the cam portion will be in proper position to engage the fixed engageable means for wiring board injection upon installation of the wiring board within the wiring board cell, and (e) each flat stock member formed by a branching bifurcation portion has an elongated slot formed therein, said tynes being formed as peninsular elements extending longitudinally into said elongated aperture from an end of the elongated aperture, the end of said peninsular element having formed thereon an integral protuberance projecting toward the confronting face of the wiring board to cause the tyne to be in a resiliently flexed condition when the wiring board is interposed between the branching bifurcation portions.

2. Apparatus as defined in claim 1, wherein;
  (a) the end of said tyne is located along a radial reference line through the pivot axis at a distance from said pivot axis which is no greater than the shortest distance between the pivot axis and the outer edge of the wiring board, whereby the protuberance at the end of each tyne resiliently engages the wiring board throughout the full range of pivotal angular motion of the inject-eject cam relative to the wiring board.

* * * * *